(12) United States Patent
Kim

(10) Patent No.: US 12,388,014 B2
(45) Date of Patent: Aug. 12, 2025

(54) INTEGRATED CIRCUIT

(71) Applicant: Samsung Electronics Co., Ltd., Suwon-si (KR)

(72) Inventor: Myoungsoo Kim, Hwaseong-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 341 days.

(21) Appl. No.: 17/942,411

(22) Filed: Sep. 12, 2022

(65) Prior Publication Data
US 2023/0260901 A1 Aug. 17, 2023

(30) Foreign Application Priority Data
Feb. 16, 2022 (KR) .................. 10-2022-0020399

(51) Int. Cl.
| | | |
|---|---|---|
| *H01L 23/522* | (2006.01) | |
| *H01L 23/528* | (2006.01) | |
| *H01L 23/532* | (2006.01) | |
| *H10D 1/00* | (2025.01) | |
| *H10D 1/47* | (2025.01) | |
| *H10D 1/68* | (2025.01) | |
| *H10D 84/00* | (2025.01) | |

(52) U.S. Cl.
CPC ...... *H01L 23/5228* (2013.01); *H01L 23/5223* (2013.01); *H01L 23/5283* (2013.01); *H01L 23/53214* (2013.01); *H10D 1/474* (2025.01); *H10D 1/692* (2025.01)

(58) Field of Classification Search
CPC ......... H01L 23/5228; H01L 23/53214; H10D 1/474; H10D 1/692; H10D 1/696; H10D 1/716; H10D 1/47; H10D 1/68; H10D 84/811
See application file for complete search history.

(56) References Cited

U.S. PATENT DOCUMENTS

| | | |
|---|---|---|
| 7,898,059 B2 | 3/2011 | Remmel et al. |
| 8,089,135 B2 | 1/2012 | Lindgren et al. |
| 8,445,353 B1 | 5/2013 | Raghavan et al. |
| 9,564,217 B1* | 2/2017 | Zhou ............... H10D 86/60 |
| 10,083,649 B2 | 9/2018 | Kim |
| 10,903,277 B2 | 1/2021 | Yi |
| 2008/0042181 A1* | 2/2008 | Watarai ............ H10D 1/716 257/306 |
| 2011/0284991 A1* | 11/2011 | Hijioka ............ H10D 1/716 257/532 |

(Continued)

FOREIGN PATENT DOCUMENTS

KR 10-2009-0056329 A 6/2009

*Primary Examiner* — Omar F Mojaddedi
(74) *Attorney, Agent, or Firm* — Harness, Dickey & Pierce, P.L.C.

(57) ABSTRACT

An integrated circuit is provided. The integrated circuit includes a substrate, one or more active devise such as one or more transistors arranged on the substrate, a plurality of interlayer dielectrics arranged on the substrate, a first metallization pattern arranged on the plurality of interlayer dielectrics, a first lower electrode arranged on the first metallization pattern, a first dielectric layer arranged on the first lower electrode, and a first upper electrode arranged on the first dielectric layer, wherein a thickness of the first metallization pattern in a first direction perpendicular to the substrate is not uniform, e.g. is variable, e.g. is not planar.

20 Claims, 11 Drawing Sheets

(56) References Cited

U.S. PATENT DOCUMENTS

| | | | | |
|---|---|---|---|---|
| 2013/0234291 A1* | 9/2013 | Miyamoto | ............. | H01L 24/32 |
| | | | | 257/534 |
| 2019/0057949 A1* | 2/2019 | Hwang | ................... | H01L 24/02 |
| 2019/0103227 A1* | 4/2019 | Lu | .......................... | H10D 1/714 |
| 2020/0111840 A1* | 4/2020 | Yi | ............................ | H10D 1/68 |
| 2023/0083357 A1* | 3/2023 | Duan | ................... | H01L 23/481 |
| | | | | 257/532 |

\* cited by examiner

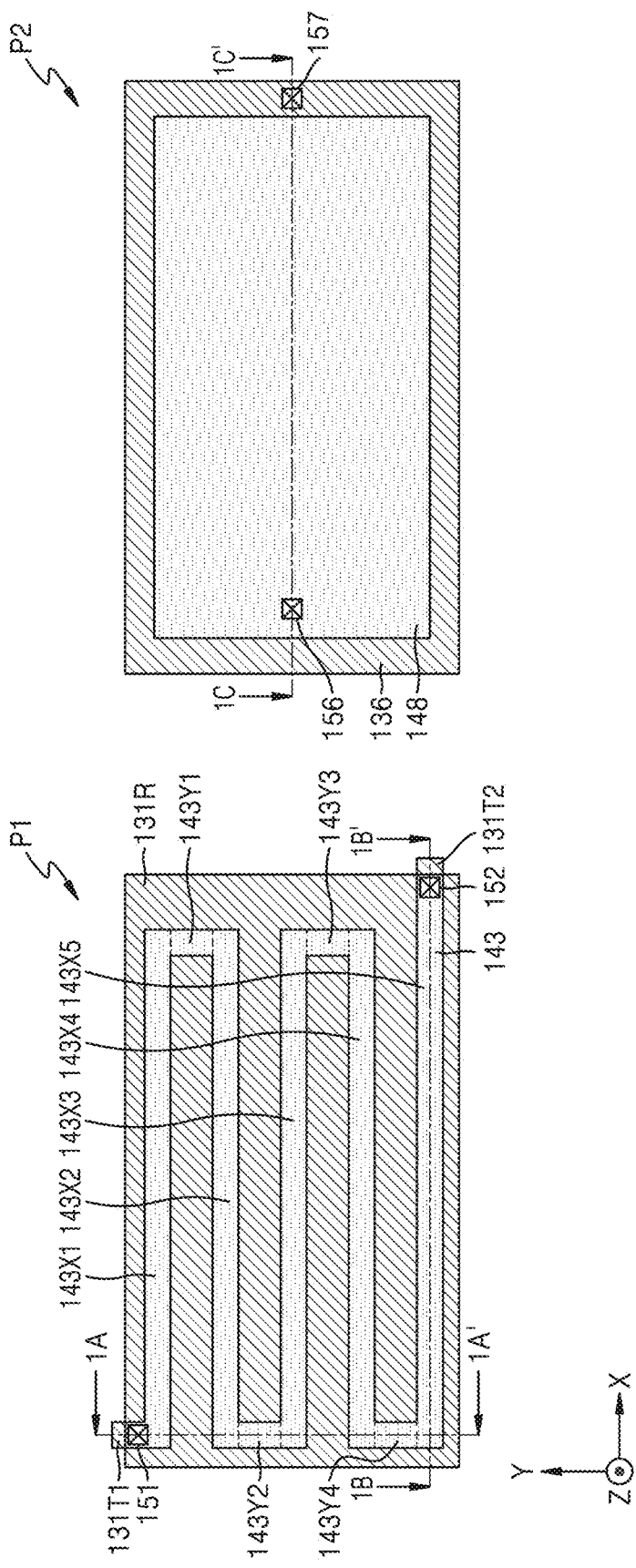

INTEGRATED CIRCUIT

CROSS-REFERENCE TO RELATED APPLICATION

This application is based on and claims priority under 35 U.S.C. § 119 to Korean Patent Application No. 10-2022-0020399, filed on Feb. 16, 2022, in the Korean Intellectual Property Office, the disclosure of which is incorporated by reference herein in its entirety.

BACKGROUND

Inventive concepts relate to an integrated circuit, and more particularly, to an integrated circuit including passive devices having a metal-insulator-metal (MIM) structure.

An analog semiconductor device performs various functions such as one or more of input/output interface, power management, signal detection/amplification, etc. with respect to a digital device. The analog semiconductor device may include active devices, such as a transistor and/or a diode, and passive devices, such as a resistor, a capacitor, and an inductor. These devices may be on or in a substrate.

In this case, some of the passive devices may be components for circuit functions of the analog semiconductor device, and the others may be components for improving the stability and/or reliability of operations of an external device connected with the analog semiconductor device.

For example, a resistor of the analog semiconductor device may include a sink resistor of an electrostatic discharge (ESD) protection circuit and/or a fanout compensation resistor for helping to secure brightness uniformity of a large-sized flat display panel.

SUMMARY

Inventive concepts provide an integrated circuit having improved degrees of reliability and/or integration.

According to some example embodiments there is provided an integrated circuit. The integrated circuit includes a substrate, one or more transistors arranged on the substrate, a plurality of interlayer dielectrics on the substrate, a first metallization pattern on the plurality of interlayer dielectrics, a first lower electrode on the first metallization pattern, a first dielectric layer on the first lower electrode, and a first upper electrode on the first dielectric layer. A thickness of the first metallization pattern in a first direction perpendicular to the substrate is not uniform.

According to some example embodiments, there is provided an integrated circuit. The integrated circuit includes a substrate, one or more transistors on the substrate, a plurality of interlayer dielectrics on the substrate, a first passive device on the plurality of interlayer dielectrics, and an upper interlayer dielectric covering the first passive device. The first passive device includes a first metallization pattern on the plurality of interlayer dielectrics, a first lower electrode arranged on the first metallization pattern, a first dielectric layer on the first lower electrode, and a first upper electrode on the first dielectric layer. At least one of a thickness of the first metallization pattern in a first direction perpendicular to the substrate, a thickness of the first lower electrode in the first direction, and a thickness of the first dielectric layer in the first direction is not uniform.

According to some example embodiments, there is provided an integrated circuit. The integrated circuit includes a substrate, one or more transistors arranged on the substrate, a plurality of interlayer dielectrics on the substrate, a first passive device on the plurality of interlayer dielectrics, and a second passive device on the plurality of interlayer dielectrics/The first passive device includes a first metallization pattern on the plurality of interlayer dielectrics, a first lower electrode on the first metallization pattern, a first dielectric layer on the first lower electrode, and a first upper electrode on the first dielectric layer, the second passive device includes a second metallization pattern on the plurality of interlayer dielectrics, a second lower electrode on the second metallization pattern, a second dielectric layer on the second lower electrode, and a second upper electrode on the second dielectric layer, the first metallization pattern includes an overlapping portion overlapping the first upper electrode in a first direction perpendicular to the substrate and a remaining portion apart from the first upper electrode in a second direction perpendicular to the first direction. A thickness of the remaining portion in the first direction is less than a thickness of the overlapping portion in the first direction, and a thickness of the second metallization pattern in the first direction is constant.

BRIEF DESCRIPTION OF THE DRAWINGS

Various example embodiments will be more clearly understood from the following detailed description taken in conjunction with the accompanying drawings in which:

FIG. 1 is a plan view of an integrated circuit according to some example embodiments;

DETAILED DESCRIPTION OF VARIOUS EXAMPLE EMBODIMENTS

Figure 2A:
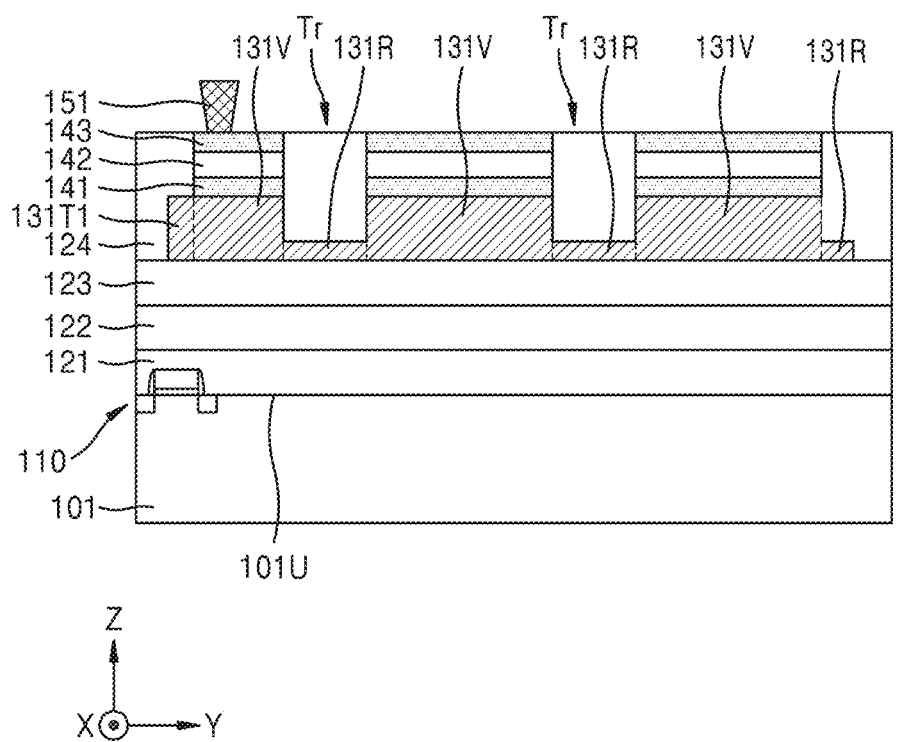
FIG. 2A is a cross-sectional view of an integrated circuit taken along a line 1A-1A' of FIG. 1.

Hereinafter, some example embodiments of inventive concepts are described in detail with reference to the accompanying drawings. The same components on the drawings are referred to by using the same reference numerals, and the same descriptions are not repeatedly given.

FIG. 1 is a plan view of an integrated circuit 1 according to an example embodiment.

FIG. 2A is a cross-sectional view of the integrated circuit 1 of FIG. 1, taken along a line 1A-1A'.

Figure 2B:
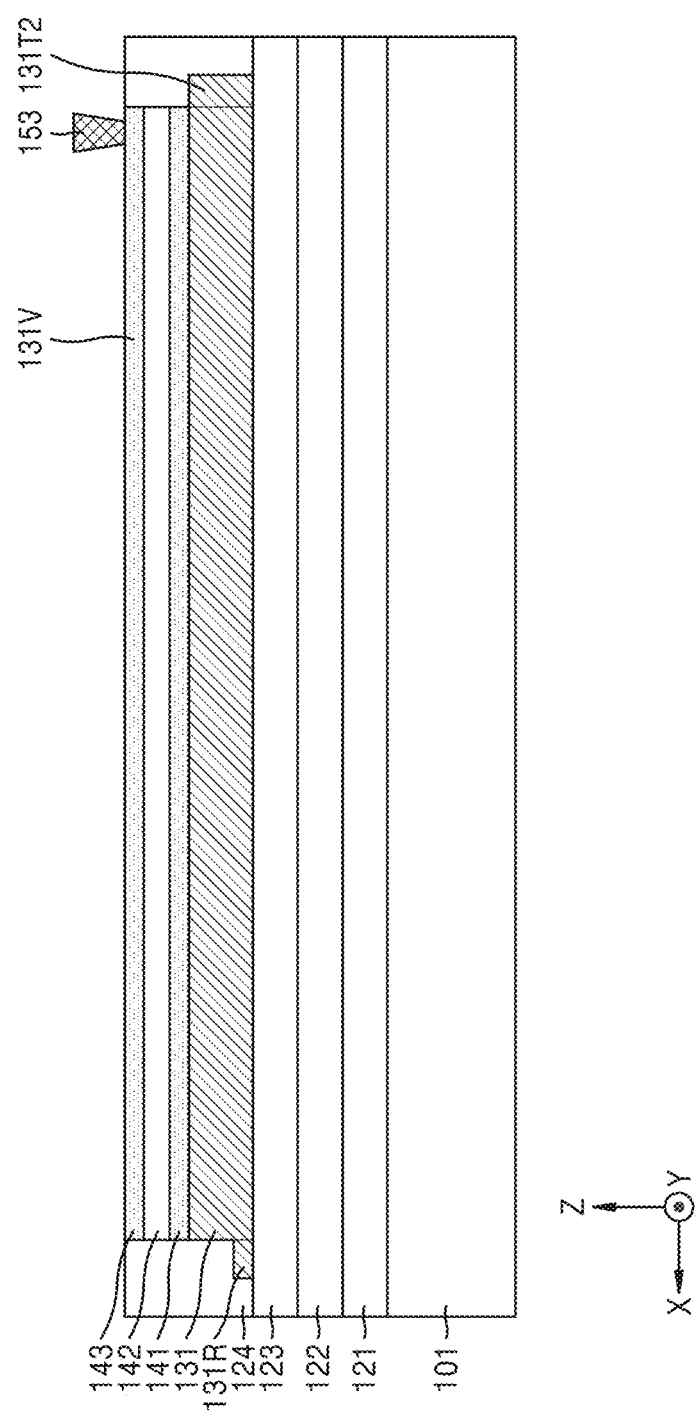
FIG. 2B is a cross-sectional view of an integrated circuit taken along a line 1B-1B' of FIG. 1.

FIG. 2B is a cross-sectional view of the integrated circuit 1 of FIG. 1, taken along a line 1B-1B'.

Figure 2C:
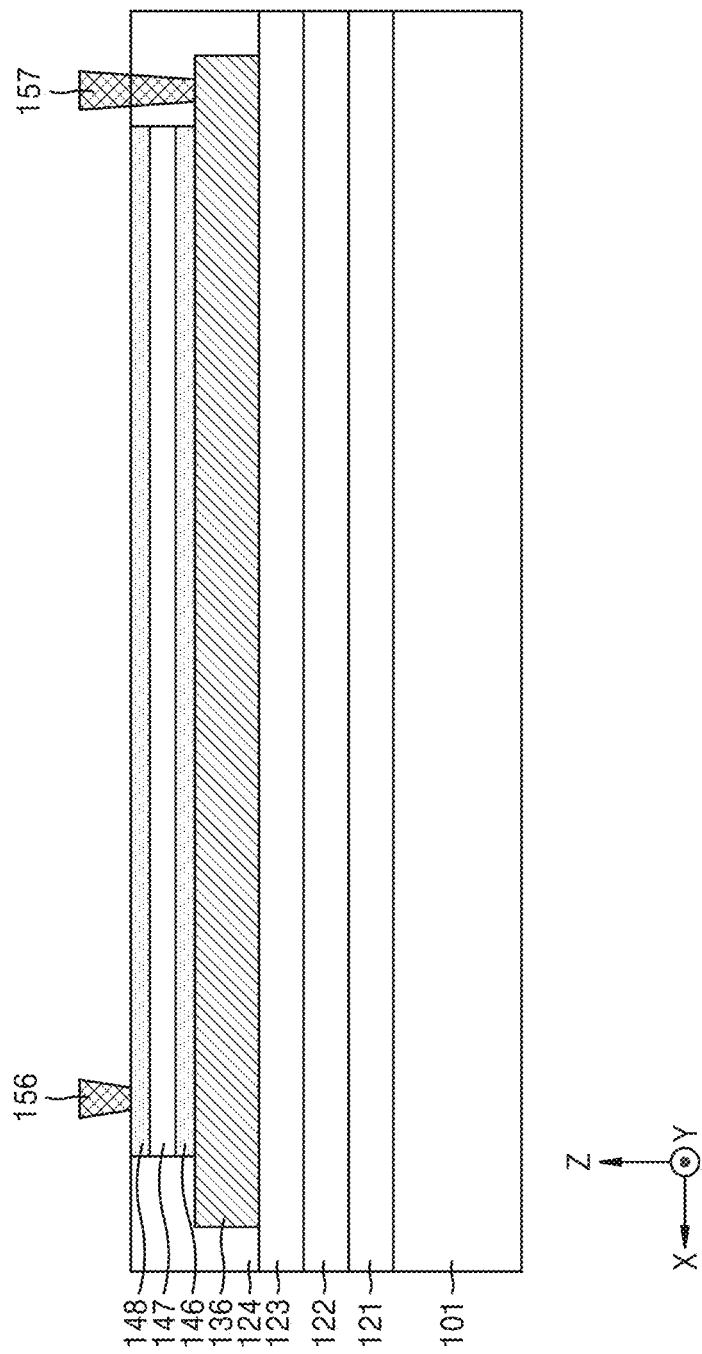
FIG. 2C is a cross-sectional view of an integrated circuit taken along a line 1C-1C' of FIG. 1.

FIG. 2C is a cross-sectional view of the integrated circuit 1 of FIG. 1, taken along a line 1C-1C'.

Referring to FIGS. 1 through 2C, the integrated circuit 1 may include a substrate 101, one or more active devices such as one or more transistors 110, a plurality of interlayer dielectrics 121, 122, 123, and 124, a first metallization pattern 131, a second metallization pattern 136, a first lower electrode 141, a second lower electrode 146, a first dielectric layer 142, a second dielectric layer 147, a first upper electrode 143, a second upper electrode 148, a first contact 151, a second contact 152, a third contact 156, and a fourth contact 157.

According to some embodiments, the substrate 101 may be or may include a semiconductor substrate including a semiconductor material, such as single-crystal silicon and/or single-crystal germanium. The substrate 101 may include, for example, a semiconductor material, such as silicon, germanium, silicon-germanium, etc., and may further include one or more of an epitaxial layer, a silicon-on-insulator (SOI) layer, a germanium-on-insulator (GOI) layer, a semiconductor-on-insulator (SeOI) layer, etc.

Hereinafter, a direction substantially perpendicular to an upper surface 101U of the substrate 101 is defined as a Z direction, and two directions substantially parallel to the upper surface 101U of the substrate 101 are defined as an X direction and a Y direction. The X and Y directions and the Z directions may be substantially perpendicular to each other. Unless described otherwise or otherwise clear from context, the definition of the directions is the same with respect to the drawings hereinafter.

The substrate 100 may include an active area in which the one or more active device such as transistors 110 are formed, along with a field area defining the active area. A device isolation layer isolating adjacent active areas from each other may be formed in the field area. The one or more transistors 110 may include a gate insulating layer, a gate electrode, a spacer, a source area, and a drain area.

Although the one or more transistors 110 are illustrated as being planar, example embodiments are not limited thereto. For example, the one or more transistors 110 may include FIN-field-effect transistors (FINFets). Furthermore although the transistors 110 are illustrated as extending in the X direction, example embodiments are not limited thereto, and the transistors 110 may alternatively or additionally extend in the Y direction.

The plurality of interlayer dielectrics 121, 122, and 123 covering the transistors 110 may be arranged on the substrate 101. The plurality of interlayer dielectrics 121, 122, and 123 may include a low dielectric material (e.g. a low-k dielectric material). The plurality of interlayer dielectrics 121, 122, and 123 may include, for example, silicon oxide. The interlayer dielectrics 121, 122, and 123 may include one or more of plasma enhanced oxide (PEOX), tetraethyl orthosilicate (TEOS), boro tetraethyl orthosilicate (BTEOS), phosphorous tetraethyl orthosilicate (PTEOS), boro phospho tetraethyl orthosilicate (BPTEOS), boro silicate glass (BSG), phospho silicate glass (PSG), boro phospho silicate glass (BPSG), etc.

The first metallization pattern 131 and the second metallization pattern 136 may be formed by a metallization process (for example in a process of etching a metallization layer and/or performing a damascene process) in a back end of line (BEOL) process. The first metallization pattern 131 and the second metallization pattern 136 may be formed simultaneously with traces and pads for routing the transistors 110 formed on the substrate 101. As a non-limiting example, the first metallization pattern 131 and the second metallization pattern 136 may be included in an uppermost metallization layer.

According to some example embodiments, the first metallization pattern 131 and the second metallization pattern 136 may include the same material as each other. According to some example embodiments, the first metallization pattern 131 and the second metallization pattern 136 may include Al, but are not limited thereto,. For example, the first metallization pattern 131 and the second metallization pattern 136 may include one or more of W, Cu, etc.

The first lower electrode 141 may be arranged on the first metallization pattern 131. The second lower electrode 146 may be arranged on the second metallization pattern 136. The first lower electrode 141 may contact the first metallization pattern 131. The second lower electrode 146 may contact the second metallization pattern 136. According to some example embodiments, the first lower electrode 141 may be a passivation layer of the first metallization pattern 131. The second lower electrode 146 may be a passivation layer of the second metallization pattern 136.

The first lower electrode 141 and the second lower electrode 146 may be arranged at the same level from the upper surface 101U of the substrate 101. For example, a distance in a Z direction from the upper surface 101U of the substrate 101 to the first lower electrode 141 may be substantially the same as a distance in the Z direction from the upper surface 101U of the substrate 101 to the second lower electrode 146.

According to some example embodiments, the first lower electrode 141 and the second lower electrode 146 may include the same material as each other. According to some example embodiments, each of the first lower electrode 141 and the second lower electrode 146 may include, but are not limited to, TiN. For example, each of the first lower electrode 141 and the second lower electrode 146 may include one or more of Ru, $RuO_2$, Pt, Ir, $Ir_2O_3$, $SrRuO_3$, TaN, WN, TiAlN, etc.

The first dielectric layer 142 may be arranged on the first lower electrode 141. The second dielectric layer 147 may be arranged on the second lower electrode 146. The first dielectric layer 142 may contact the first lower electrode 141. The second dielectric layer 147 may contact the second lower electrode 146.

The first dielectric layer 142 and the second dielectric layer 147 may be arranged at the same level from the upper surface 101U of the substrate 101. For example, a distance in the Z direction from the upper surface 101U of the substrate 101 to the first dielectric layer 142 may be substantially the same as a distance in the Z direction from the upper surface 101U of the substrate 101 to the second dielectric layer 147.

According to some example embodiments, the first dielectric layer 142 and the second dielectric layer 147 may include the same material as each other. According to some example embodiments, each of the first dielectric layer 142 and the second dielectric layer 147 may include an insulating material. According to some example embodiments, each of the first dielectric layer 142 and the second dielectric layer 147 may include any one of $SiO_2$, SiN, $ZrO_2$, $HfO_2$, $TiO_2$, $Ta_2O_5$, $SrTiO_3$, $CaTiO_3$, $LaAlO_3$, $BaZrO_3$, $BaSrTiO_3$, $BaZrTiO_3$, and $SrZrTiO_3$.

The first upper electrode 143 may be arranged on the first dielectric layer 142. The second upper electrode 148 may be arranged on the second dielectric layer 147. The first upper electrode 143 may contact the first dielectric layer 142. The second upper electrode 148 may contact the second dielectric layer 147.

The first upper electrode 143 and the second upper electrode 148 may be arranged at the same level from the upper surface 101U of the substrate 101. For example, a distance in the Z direction from the upper surface 101U of the substrate 101 to the first upper electrode 143 may be substantially the same as a distance in the Z direction from the upper surface 101U of the substrate 101 to the second upper electrode 148.

According to some example embodiments, the first upper electrode 143 and the second upper electrode 148 may include the same material as each other. According to some example embodiments, the first upper electrode 143 and the second upper electrode 148 may include any one of the materials exemplified with respect to the first lower electrode 141 and the second lower electrode 146.

According to some example embodiments, the first upper electrode 143 and the second upper electrode 148 may include or more or all of the same material as the first lower electrode 141 and the second lower electrode 146. According to some example embodiments, the first upper electrode 143 and the second upper electrode 148 may include a different material from the first lower electrode 141 and the second lower electrode 146.

The first contact 151 and the second contact 152 may extend in the Z direction. Each of the first contact 151 and the second contact 152 may be connected to the first upper electrode 143. Each of the first contact 151 and the second contact 152 may contact the first upper electrode 143. The first contact 151 may be arranged horizontally adjacent to a first terminal end 131T1, and the second contact 152 may be arranged horizontally adjacent to a second terminal end 131T2.

The third contact 156 and the fourth contact 157 may extend in the Z direction. The third contact 156 may be connected to the second upper electrode 148, and the fourth contact 157 may be connected to the second metallization pattern 136.

According to some example embodiments, the integrated circuit 1 may further include a first passive device P1 and a second passive device P2. The first passive device P1 and the second passive device P2 may be apart from each other in a horizontal direction (for example, the X direction and the Y direction). The first passive device P1 and the second passive device P2 may be arranged on the plurality of interlayer dielectrics 121, 122, and 123. According to some example embodiments, the first passive device P1 and the second passive device P2 may be formed at substantially the same level from the upper surface 101U of the substrate 101.

According to some example embodiments, the first passive device P1 may include the first metallization pattern 131, the first lower electrode 141, the first dielectric layer 142, the first upper electrode 143, the first contact 151, and the second contact 152. That is, the first metallization pattern 131, the first lower electrode 141, the first dielectric layer 142, the first upper electrode 143, the first contact 151, and the second contact 152 may form the first passive device P1.

According to some example embodiments, the second passive device P2 may include the second metallization pattern 136, the second lower electrode 146, the second dielectric layer 147, the second upper electrode 148, the third contact 156, and the fourth contact 157. For example, the second metallization pattern 136, the second lower electrode 146, the second dielectric layer 147, the second upper electrode 148, the third contact 156, and the fourth contact 157 may form the second passive device P2.

The interlayer dielectric 124 may cover the first metallization pattern 131, the second metallization pattern 136, the first lower electrode 141, the second lower electrode 146, the first dielectric layer 142, the second dielectric layer 147, the first upper electrode 143, and the second upper electrode 148.

The interlayer dielectric 124 may include any one of the materials above exemplified with respect to the interlayer dielectrics 121, 122, and 123. The interlayer dielectric 124 may also be referred to as an upper interlayer dielectric.

According to some example embodiments, the first passive device P1 and the second passive device P2 may be or may include metal-insulator-metal (MIM) passive devices. According to some example embodiments, the first passive device P1 may be an MIM resistor (e.g. a serpentine resistor), and the second passive device P2 may be an MIM capacitor.

Here, an MIM refers to a structure in which a metal layer, an insulating material layer, and a metal layer are sequentially stacked, such as a stack of the first lower electrode 141, the first dielectric layer 142, and the first upper electrode 143 and a stack of the second lower electrode 146, the second dielectric layer 147, and the second upper electrode 148.

The first contact 151 and the second contact 152 may be terminal points or pad points of the first passive device P1. An equivalent resistance between the first contact 151 and the second contact 152 may be a resistance of the first passive device P1, which may correspond to a current path between the first contact 151 and the second contact 152.

According to some example embodiments, the first upper electrode 143 may define the resistance of the first passive device P1. TiN has high resistivity and high peak current tolerance, and thus, when the first upper electrode 143 includes TiN, the first passive device P1 having high resistance and high peak current tolerance may be provided in or within a small area. Additionally or alternatively, a resistor formed in a front end of line (FEOL) process occupies a specific (e.g. variably determined or, alternatively, predetermined) area of the substrate 101, and thus, may deteriorate the degree of integration of the integrated circuit 1. Additionally or alternatively, subsequent high temperature processes may cause an unstable resistance. However, the first upper electrode 143 including TiN may have a more highly precise resistance. Therefore, the degree of integration and/or the reliability of the integrated circuit 1 may increase.

The first upper electrode 143 may include a number of portions, such as first through fifth row portions 143X1, 143X2, 143X3, 143X4, and 143X5 extending in the X direction and first through fourth column portions 143Y1, 143Y2, 143Y3, and 143Y4 extending in the Y direction. For convenience of explanation, boundary lines between the first through fifth row portions 143X1 through 143X5 and the first through fourth column portions 143Y1 through 143Y4 are indicated as broken lines in FIG. 1.

According to some example embodiments, a planar shape of the first upper electrode 143 may be zigzag or serpentine. Here, the planar shape denotes a shape when a surface parallel to the upper surface 101U of the substrate 101 is viewed in the Z direction.

According to some example embodiments, a corresponding one of the first through fourth column portions 143Y1 through 143Y4 of the first upper electrode 143, the first through fourth column portions 143Y1 through 143Y4 extending in the Y direction, may be arranged between the first through fifth row portions 143X1 through 143X5 of the first upper electrode 143, and a corresponding one of the first through fifth row portions 143X1 through 143X5 of the first upper electrode 143 may be arranged between the first through fourth column portions 143Y1 through 143Y4 of the first upper electrode 143.

The first through fourth column portions 143Y1 through 143Y4 of the first upper electrode 143 may be connected to each of both ends (for example, both ends in the X direction)

of the first through fifth row portions 143X1 through 143X5 of the first upper electrode 143. Both ends (for example, both ends in the X direction) of the first through fifth row portions 143X1 through 143X5 of the first upper electrode 143 may be connected to each of both ends (for example, both ends in the Y direction) of the first through fourth column portions 143Y1 through 143Y4 of the first upper electrode 143.

For example, the first column portion 143Y1 may be arranged to be adjacent to an end of each of the first and second row portions 143X1 and 143X2 in a +X direction, and the second column portion 143Y2 may be arranged to be adjacent to an end of each of the second and third row portions 143X2 and 143X3 in a −X direction. The first column portion 143Y1 may be connected to the end of each of the first and second row portions 143X1 and 143X2 in the +X direction, and the second column portion 143Y2 may be connected to the end of each of the second and third row portions 143X2 and 143X3 in the −X direction.

Here, the +X direction refers to a direction indicated by an arrow on the coordinate axis of FIG. 1, and the −X direction refers to a direction opposite to the +X direction. The +X direction and the −X direction are used to more clearly describe the planar shape of the first upper electrode 143. In addition, the +X direction and the −X direction are simply referred to as the X direction.

A resistance value of the first passive device P1 provided by or along the first upper electrode 143 may be the sum of line resistance values of the first through fifth row portions 143X1 through 143X5 of the first upper electrode 143 in the X direction and line resistance values of the first through fourth column portions 143Y1 through 143Y4 of the first upper electrode 143 in the Y direction. Therefore, the resistance value provided by the first upper electrode 143 may be increased, or maximized.

An MIM resistor element according to related art is formed by an additional MIM etching process after a metallization process, and thus, the MIM resistor element is patterned based on a design rule having a relatively larger pitch. Accordingly, it is or may be impossible to form a minute pattern, such as the first metallization pattern 131 of FIG. 1, and the resistance value of the MIM resistor element may decrease. A previous integrated circuit requires a plurality of serially connected MIM resistor elements or MIM resistor elements formed throughout a large area. However, this may complicate a routing design and decrease the degree of integration.

According to some example embodiments, the first upper electrode 143 may be patterned by the same etching process as the first metallization pattern 131, and thus, the first upper electrode 143 having a small width may be provided. In more detail, the first upper electrode 143 may include the first through fifth row portions 143X1 through 143X5 having a small width in the Y direction and the first through fourth column portions 143Y1 through 143Y4 having a small width in the X direction. Therefore, the first passive device P1 having a small area and a large resistance may be provided, and/or a degree of integration of the integrated circuit 1 may increase.

The first lower electrode 141 may be apart from the first upper electrode 143 with the interlayer dielectric 124 therebetween. The first lower electrode 141 may be insulated from or isolated from the first upper electrode 143. Therefore, the first lower electrode 141 and the first metallization pattern 131 may be electrically floated. According to some example embodiments, the first lower electrode 141 and the first metallization pattern 131 are apart from the first upper electrode 143, and thus, a cross-sectional area of a resistance portion of the first passive device P1 in an extension direction may be sufficiently reduced, and the first passive device P1 having a large resistance value may be provided.

Here, a cross-sectional area of the first through fifth row portions 143X1 through 143X5 in a longitudinal direction thereof denotes a cross-sectional area of the first through fifth row portions 143X1 through 143X5 on an YZ plane perpendicular to the X direction. Also, a cross-sectional area of the first through fourth column portions 143Y1 through 143Y4 in the longitudinal direction thereof denotes a cross-sectional area of the first through fourth column portions 143Y1 through 143Y4 on a ZX plane perpendicular to the Y direction.

For example, when the first lower electrode 141 and the first upper electrode 143 include titanium nitride, and the first metallization pattern 131 includes aluminum, the first metallization pattern 131 including aluminum having a relatively large resistivity may be electrically insulated/isolated from the first upper electrode 143, so that the first passive device P1 having a large resistance value may be provided.

According to some example embodiments, the first lower electrode 141, the first dielectric layer 142, and the first upper electrode 143 may have substantially the same planar shape as one another.

According to some example embodiments, the first metallization pattern 131 may include an overlapping portion 131V overlapping the first upper electrode 143 in the Z direction, a remaining portion 131R horizontally apart from the first upper electrode 143 (for example, not overlapping the first upper electrode 143 in the Z direction), a first terminal end 131T1, and a second terminal end 131T2.

The first terminal end 131T1 and the second terminal end 131T2 may be inlet/output areas of a contact to respectively form the first contact 151 and the second contact 152.

According to some example embodiments, the first metallization pattern 131 may have a variable thickness (or length) in the Z direction. According to some example embodiments, the first metallization pattern 131 may not have a uniform thickness in the Z direction. According to some example embodiments, the first metallization pattern 131 may not have a planar upper level with respect to an upper surface of the substrate 101 According to some example embodiments, a thickness of the remaining portion 131R in the Z direction may be different from thicknesses of the first terminal end 131T1 and the second terminal end 131T2 in the Z direction. According to some example embodiments, the thickness of the remaining portion 131R in the Z direction may be less than the thicknesses of the overlapping portion 131V, the first terminal end 131T1, and the second terminal end 131T2 in the Z direction.

According to some example embodiments, the remaining portion 131R may be etched after the first lower electrode 141, the first dielectric layer 142, and the first upper electrode 143 are removed, and thus, the remaining portion 131R may not be completely etched, despite the etching process. For example, in an etching process of a metallization layer, the remaining portion 131R may be protected by the removed portion of the first lower electrode 141, the removed portion of the first dielectric layer 142, and the removed portion of the first upper electrode 143, and thus, may be partially etched. Therefore, the remaining portion 131R may have a less thickness in the Z direction compared to the overlapping portion 131V, the first terminal end 131T1, and the second terminal end 131T2.

According to some example embodiments, an upper surface of the remaining portion 131R of the first metallization pattern 131, a side surface of the overlapping portion 131V of the first metallization pattern 131, a side surface of the first lower electrode 141, a side surface of the first dielectric layer 142, and a side surface of the first upper electrode 143 may define a trench Tr extending in the X direction.

The interlayer dielectric 124 may fill the trench Tr. Therefore, the interlayer dielectric 124 may contact the upper surface of the remaining portion 131R of the first metallization pattern 131, the side surface of the overlapping portion 131V of the first metallization pattern 131, the side surface of the first lower electrode 141, the side surface of the first dielectric layer 142, and the side surface of the first upper electrode 143.

The upper surface of the remaining portion 131R of the first metallization pattern 131 may be a bottom surface of the trench Tr. Each of the side surface of the overlapping portion 131V of the first metallization pattern 131, the side surface of the first lower electrode 141, the side surface of the first dielectric layer 142, and the side surface of the first upper electrode 143 may be a side wall of the trench Tr.

The third contact 156 and the fourth contact 157 may be terminal points of the second passive device P2. An equivalent capacitance between the third contact 156 and the fourth contact 157 may be a capacitance of the second passive device P2.

An area of the second lower electrode 146, an area of the second upper electrode 148, and an area and a dielectric constant of the second dielectric layer 147 may be factors in determining the capacitance of the second passive device P2. According to some example embodiments, in order to increase, e.g. to maximize the capacitance of the second passive device P2, the second lower electrode 146, the second dielectric layer 147, and the second upper electrode 148 may have a large area.

According to some example embodiments, the second lower electrode 146, the second dielectric layer 147, and the second upper electrode 148 may have substantially the same planar shape. According to some example embodiments, the second lower electrode 146, the second dielectric layer 147, and the second upper electrode 148 may approximately have a quadrangular planar shape. According to some example embodiments, the second lower electrode 146, the second dielectric layer 147, and the second upper electrode 148 may have a less horizontal area than the second metallization pattern 136.

According to some example embodiments, the third contact 156 may be connected to the second upper electrode 148, and the fourth contact 157 may be connected to the second lower electrode 146 through the second metallization pattern 136. Therefore, the second lower electrode 146 may operate as an electrode of a capacitor, and the second upper electrode 148 may operate as the other electrode of the capacitor.

Figure 3:
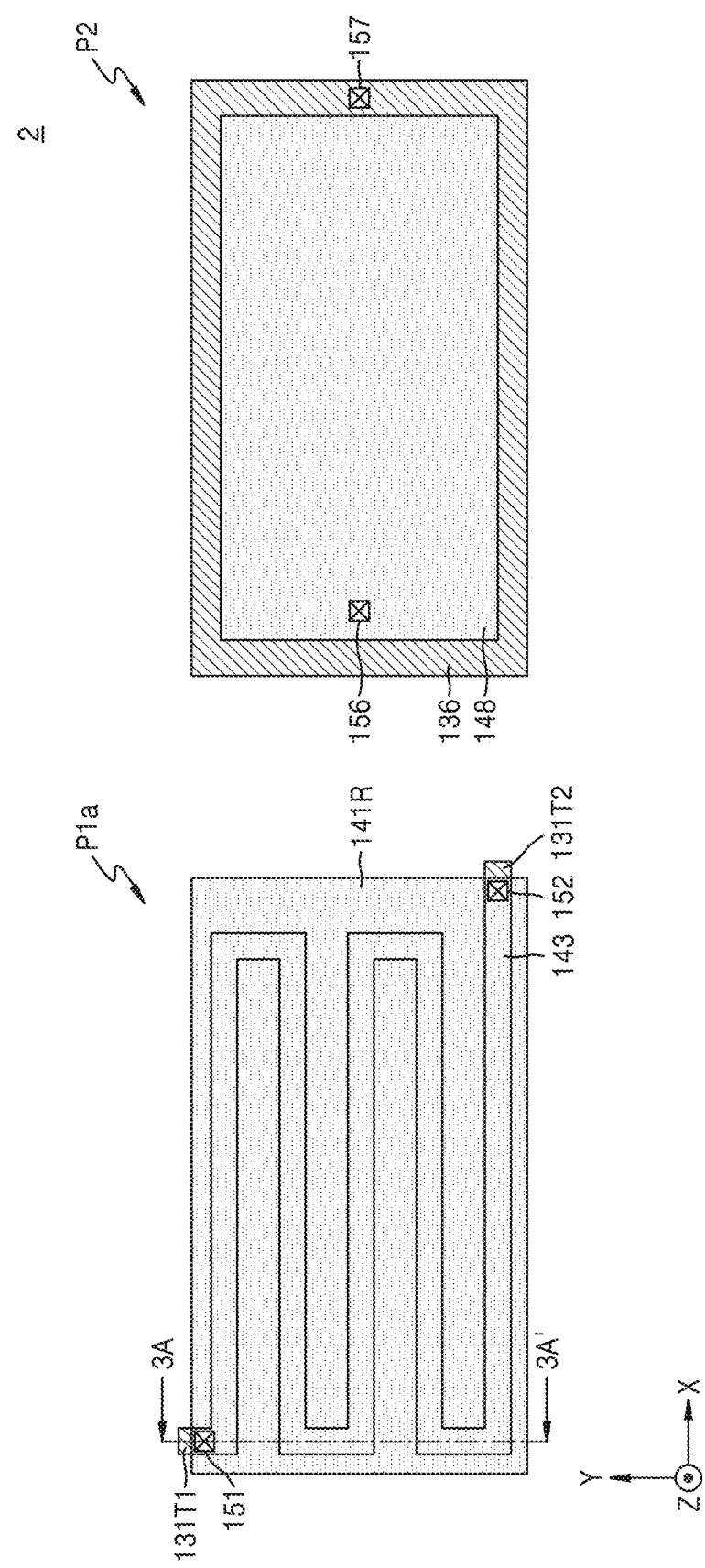
FIG. 3 is a plan view for describing an integrated circuit according to other example embodiments.

FIG. 3 is a plan view for describing an integrated circuit 2 according to some example embodiments.

Figure 4:
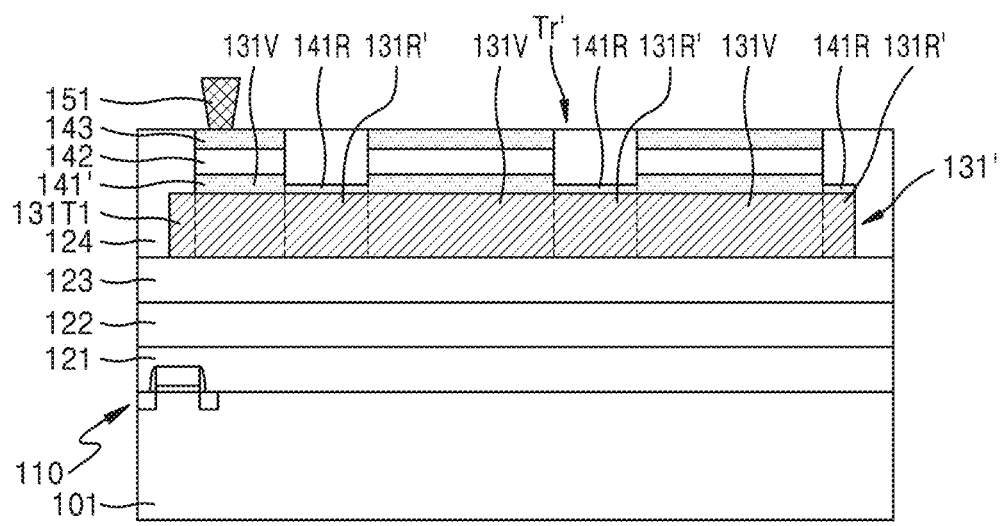
FIG. 4 is a cross-sectional view of an integrated circuit taken along a line 3A-3A' of FIG. 3.

FIG. 4 is a cross-sectional view of the integrated circuit 2 of FIG. 3, taken along a line 3A-3A'.

Referring to FIGS. 3 and 4, the integrated circuit 2 may include the substrate 101, the one or more transistors 110, the plurality of interlayer dielectrics 121, 122, 123, and 124, a first passive device P1a, and the second passive device P2.

The substrate 101, the one or more transistors 110, the plurality of interlayer dielectrics 121, 122, and 123, and the second passive device P2 may be substantially the same as described with reference to FIGS. 1 through 2C, and thus, the same descriptions are not given.

According to some example embodiments, the first passive device P1a may include a first metallization pattern 131', a first lower electrode 141', the first dielectric layer 142, the first upper electrode 143, the first contact 151, and the second contact 152.

According to some example embodiments, the first dielectric layer 142 and the first upper electrode 143 may have the same planar shape as described with reference to FIGS. 1 through 2C.

The first metallization pattern 131' may include the overlapping portion 131V overlapping the first upper electrode 143 in the Z direction, a remaining portion 131R' horizontally apart from the first upper electrode 143 (that is, not overlapping the first upper electrode 143 in the Z direction), the first terminal end 131T1, and the second terminal end 131T2.

Unlike some examples in FIGS. 1 through 2C, a thickness (or length) of the remaining portion 131R' in the Z direction may be substantially the same as the thickness of each of the overlapping portion 131V, the first terminal end 131T1, and the second terminal end 131T2 in the Z direction.

According to some example embodiments, in an etching process for forming the first metallization pattern 131', the first lower electrode 141' may not be completely etched. Therefore, the remaining portion 131R' of the first metallization pattern 131' may be protected by the first lower electrode 141' and may not be etched in the etching process of the metallization layer. The first metallization pattern 131' may have a substantially constant thickness in the Z direction.

According to some example embodiments, the first lower electrode 141' may include an overlapping portion 141V overlapping the first upper electrode 143 in the Z direction and a remaining portion 141R horizontally apart from the first upper electrode 143 (for example, not overlapping the first upper electrode 143 in the Z direction).

According to some example embodiments, the first lower electrode 141' may have a variable thickness (or length) in the Z direction. A thickness of the remaining portion 141R in the Z direction may be different from a thickness of the overlapping portion 141V in the Z direction. The thickness of the remaining portion 141R in the Z direction may be less than the thickness of the overlapping portion 141V in the Z direction.

According to some example embodiments, a planar shape of the first lower electrode 141' may be different from a planar shape of each of the first dielectric layer 142 and the first upper electrode 143. According to some example embodiments, the planar shape of the first lower electrode 141' may be substantially quadrangular, and the planar shape of each of the first dielectric layer 142 and the first upper electrode 143 may be zigzag.

Accordingly, the first lower electrode 141' may cover the remaining portions of the first metallization pattern 131' except for the first terminal end 131T1 and the second terminal end 131T2.

According to some example embodiments, an upper surface of the remaining portion 141R of the first lower electrode 141', a side surface of the overlapping portion 141V of the first lower electrode 141', a side surface of the first dielectric layer 142, and a side surface of the first upper electrode 143 may define a trench Tr' extending in the X direction.

The interlayer dielectric 124 may fill the trench Tr'. Therefore, the interlayer dielectric 124 may contact the upper surface of the remaining portion 141R of the first lower electrode 141', the side surface of the overlapping portion 141V of the first lower electrode 141', the side surface of the first dielectric layer 142, and the side surface of the first upper electrode 143.

The upper surface of the remaining portion 141R of the first lower electrode 141' may be a bottom surface of the trench Tr'. Each of the side surface of the overlapping portion 141V of the first lower electrode 141', the side surface of the first dielectric layer 142, and the side surface of the first upper electrode 143 may be a side wall of the trench Tr'.

Figure 5:
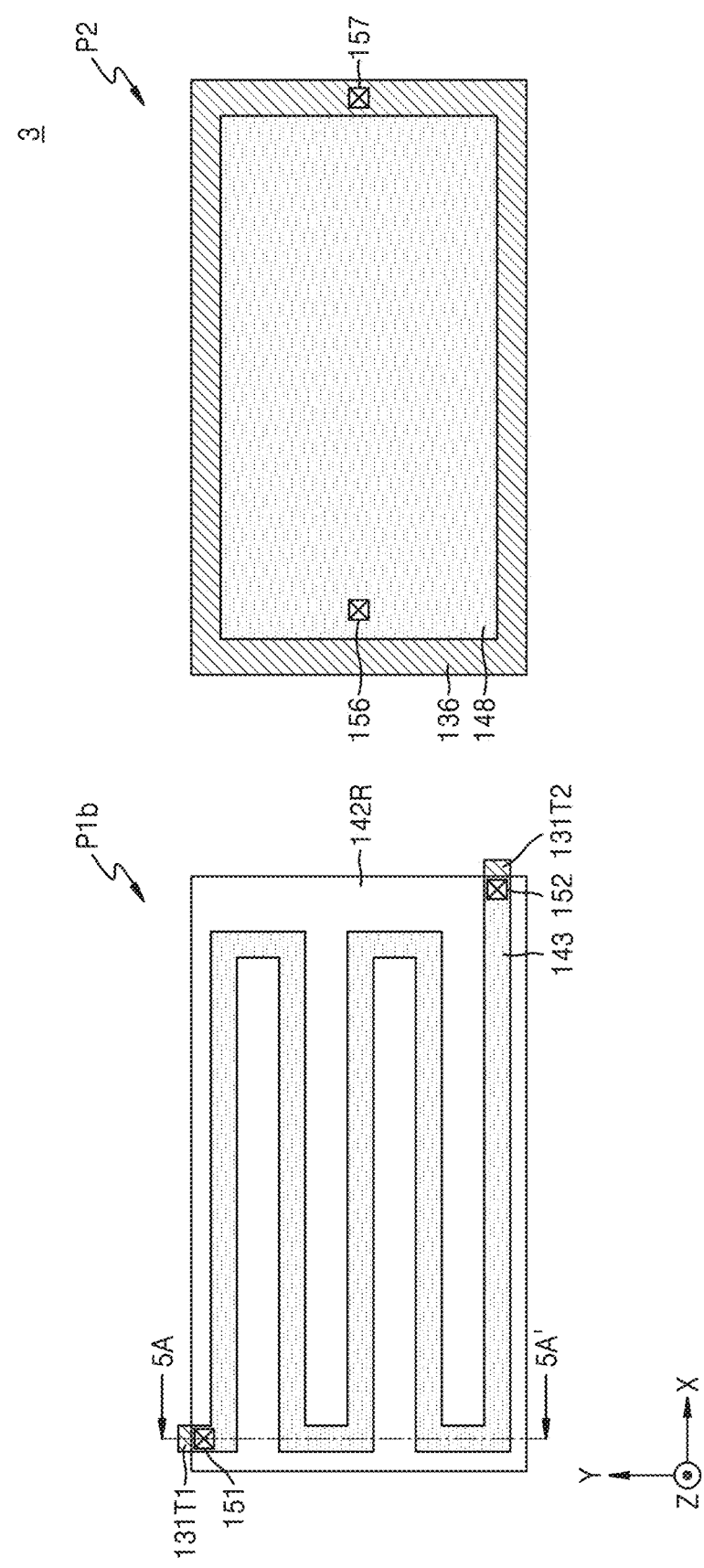
FIG. 5 is a plan view for describing an integrated circuit according to other example embodiments.

FIG. 5 is a plan view for describing an integrated circuit 3 according to other example embodiments.

Figure 6:
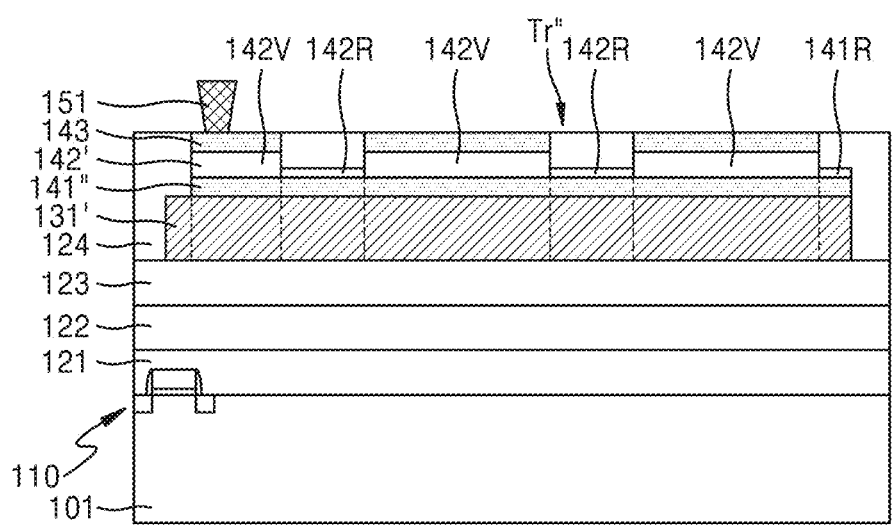
FIG. 6 is a cross-sectional view of an integrated circuit taken along a line 5A-5A' of FIG. 5.

FIG. 6 is a cross-sectional view of the integrated circuit 3 of FIG. 5, taken along a line 5A-5A'.

Referring to FIGS. 5 and 6, the integrated circuit 3 may include the substrate 101, the one or more transistors 110, the plurality of interlayer dielectrics 121, 122, 123, and 124, a first passive device P1b, and the second passive device P2.

The substrate 101, the one or more transistors 110, the plurality of interlayer dielectrics 121, 122, and 123, and the second passive device P2 may be substantially the same as described with reference to FIGS. 1 through 2C, and thus, the same descriptions are not given.

According to some example embodiments, the first passive device P1b may include the first metallization pattern 131', a first lower electrode 141", a first dielectric layer 142', the first upper electrode 143, the first contact 151, and the second contact 152.

According to some example embodiments, the first upper electrode 143 may have the same planar shape as described with reference to FIGS. 1 through 2C.

The first dielectric layer 142' may include an overlapping portion 142V overlapping the first upper electrode 143 in the Z direction and a remaining portion 142R horizontally apart from the first upper electrode 143 (that is, not overlapping the first upper electrode 143 in the Z direction).

According to some example embodiments, in an etching process for forming the first metallization pattern 131', the first dielectric layer 142' may not be completely etched. Therefore, in an etching process of a metallization layer, the first metallization pattern 131' and the first lower electrode 142" may be protected by the first dielectric layer 142' and may not be etched. According to some example embodiments, the first metallization pattern 131' and the first lower electrode 142" may have substantially constant thicknesses (or lengths) in the Z direction. The first metallization pattern 131' may have substantially the same shape as described with reference to FIGS. 3 and 4.

According to some example embodiments, the first dielectric layer 142' may include an overlapping portion 142V overlapping the first upper electrode 143 in the Z direction and a remaining portion 142R horizontally apart from the first upper electrode 143 (that is, not overlapping the first upper electrode 143 in the Z direction).

According to some example embodiments, the first dielectric layer 142' may have a variable thickness (or length) in the Z direction. A thickness of the remaining portion 142R in the Z direction may be different from a thickness of the overlapping portion 142V in the Z direction. The thickness of the remaining portion 142R in the Z direction may be less than the thickness of the overlapping portion 142V in the Z direction.

According to some example embodiments, a planar shape of the first dielectric layer 142' may be substantially the same as a planar shape of the first lower electrode 141". According to some example embodiments, the planar shape of the first dielectric layer 142' may be different from a planar shape of the first upper electrode 143. According to some example embodiments, the planar shape of the first dielectric layer 142' may be substantially quadrangular, and the planar shape of the first upper electrode 143 may be zigzag.

Accordingly, the first dielectric layer 142' may cover the remaining portions of the first metallization pattern 131' except for the first terminal end 131T1 and the second terminal end 131T2.

According to some example embodiments, an upper surface of the remaining portion 142R of the first dielectric layer 142', a side surface of the overlapping portion 142V of the first dielectric layer 142', and a side surface of the first upper electrode 143 may define a trench Tr" extending in the X direction.

The interlayer dielectric 124 may fill the trench Tr". Therefore, the interlayer dielectric 124 may contact the upper surface of the remaining portion 142R of the first dielectric layer 142', the side surface of the overlapping portion 142V of the first dielectric layer 142', and the side surface of the first upper electrode 143.

The upper surface of the remaining portion 142R of the first dielectric layer 142' may be a bottom surface of the trench Tr". Each of the side surface of the overlapping portion 142V of the first dielectric layer 142' and the side surface of the first upper electrode 143 may be a side wall of the trench Tr".

Figure 7:
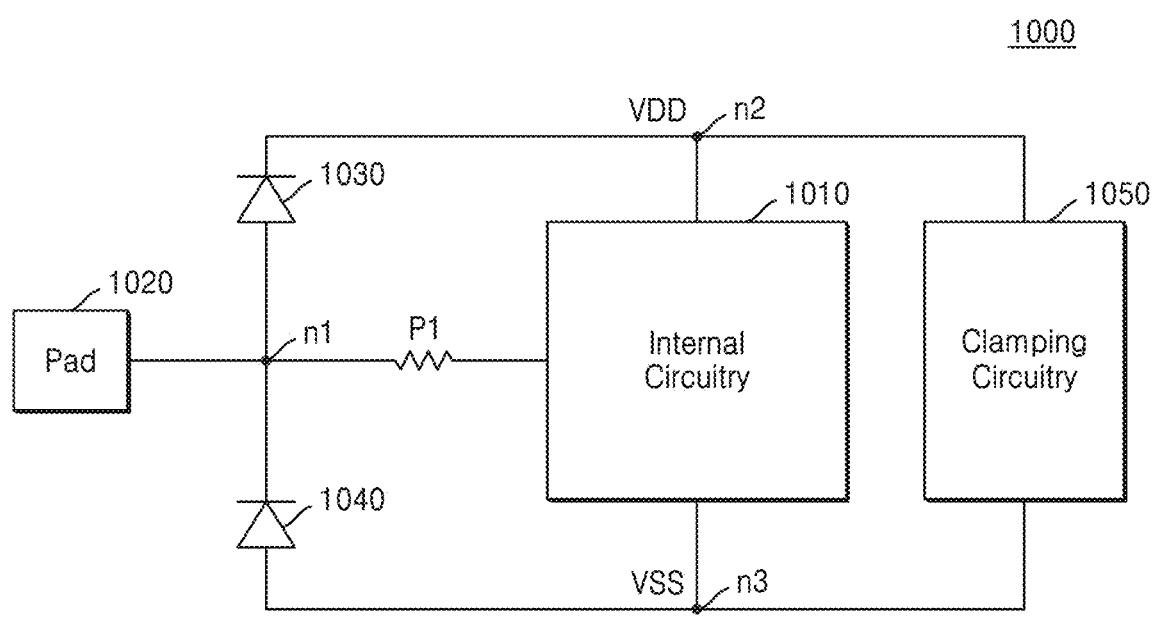
FIG. 7 is a circuit diagram for describing an electronic device according to some example embodiments.

FIG. 7 is a circuit diagram for describing an electronic device 1000 according to some example embodiments.

Referring to FIG. 7, the electronic device 1000 may include internal circuitry 1010, a pad 1020, an upper coupling diode 1030, a lower coupling diode 1040, clamping circuitry 1050, and a first passive device P1.

The pad 1020, an anode of the upper coupling diode 1030, a cathode of the lower coupling diode 1040, and a first terminal of the first passive device P1 may be connected to a first node n1. The first node n1 may provide an electrical path for receiving an input signal and outputting an output signal.

A cathode of the upper coupling diode 1030 may be connected to a second node n2. A positive supply voltage VDD may be applied to the second node n2. The internal circuitry 1010 may be connected to the second node n2 and may receive the positive supply voltage VDD required for an operation thereof.

An anode of the lower coupling diode 1040 may be connected to a third node n3. A negative supply voltage VSS may be applied to the third node n3. The internal circuitry 1010 may be connected to the third node n3 and may receive the negative supply voltage VSS required for an operation thereof.

The second node n2 and the third node n3 may be power lanes (or ground lanes).

The upper coupling diode 1030 and the lower coupling diode 1040 may provide coupling such as bi-directional coupling to the second node n2 to which the positive supply voltage VDD is applied and the third node n3 to which the negative supply voltage VSS is applied.

The clamping circuitry 1050 may be connected to the second node n2 and the third node n3 and may maintain the positive supply voltage VDD and the negative supply voltage VSS to be stable. The clamping circuitry 1050 may form a conductive path from the second node n2 to the third node n3, for example, to a VSS rail, thereby providing an electrostatic discharge (ESD) path from the second node n2 to the third node n3.

According to some example embodiments, the upper coupling diode 1030, the lower coupling diode 1040, and the clamping circuitry 1050 may not only effectively block the positive supply voltage VDD and the negative supply voltage VSS, but may also appropriately discharge ESD pulses and noise.

The first terminal of the first passive device P1 may be connected to the internal circuitry 1010. The first passive device P1 may prevent damage to the internal circuitry 1010, the damage being caused by the ESD which may occur when a power supply supplying driving power to the electronic device 1000 is turned on.

The first passive device P1 is the same as described with reference to FIGS. 1 through 2C.

Figure 8:
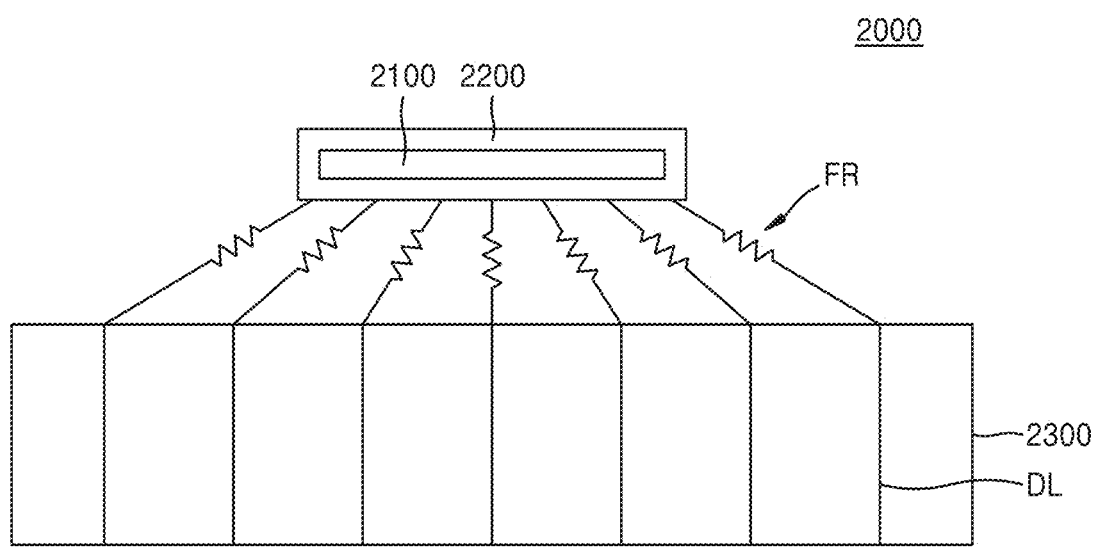
FIG. 8 is a diagram of a display device according to some example embodiments.

FIG. 8 is a diagram of a display device 2000 according to some example embodiments.

Figure 9:
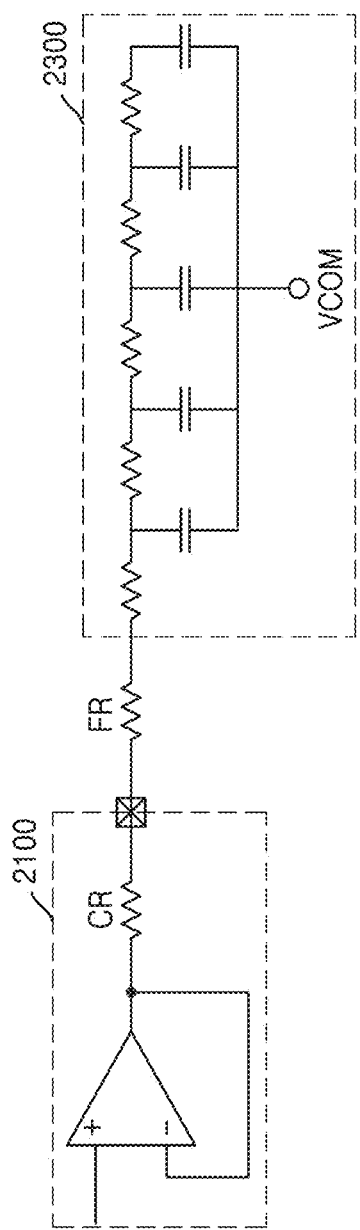
FIG. 9 is a schematic circuit diagram for describing fanout resistance compensation of a display device.

FIG. 9 is a schematic circuit diagram for describing fanout resistance compensation of the display device 2000.

Referring to FIGS. 8 and 9, the display device 2000 may include a display driving integrated circuit 2100, a substrate 2200, and a display panel 2300.

According to some example embodiments, the display device 2000 may be loaded on an electronic device having an image display function. For example, the electronic device may include one or more of a smartphone, a tablet personal computer (PC), a portable multimedia player (PMP), a camera, a wearable device, a television, a digital video disk (DVD) player, a refrigerator, an air conditioner, an air cleaner, a set-top box, a robot, a drone, various medical devices, a navigation device, a global positioning system (GPS) receiver, an advanced driver's assistance system (ADAS), a vehicle device, furniture, or various measuring devices.

According to some example embodiments, the display driving integrated circuit 2100 and the display panel 2300 may be realized as one module. The substrate 2200 may be any one of a glass substrate, a polyimide substrate, and a flexible film substrate.

The display panel 2300 may display an image according to a data signal applied from the data driving integrated circuit 2100 and a gate signal applied from a gate driving integrated circuit device. The display panel 2300 may include a plurality of data lines for receiving a signal from the data driving integrated circuit 2100.

Here, as a distance from the center of the display panel 2300 is increased, a length of an electrical path from the data driving integrated circuit 2100 to the plurality of data lines DL of the display panel 2300 may be increased. The resistance due to this electrical path is defined as fanout resistance FR. The fanout resistance FR may have an increased value as a distance from the center of the display panel 2300 is increased.

The data signal that is output from the data driving integrated circuit device 2100 may have a uniform intensity, but the data signal reaching the data lines DL through the fanout resistance FR may have a non-uniform intensity. The data lines DL in a peripheral area are connected to a greater fanout resistance FR than the data lines DL at the center, and thus, the brightness of the display panel 2300 may decrease from the center to the peripheral area.

According to some example embodiments, the display driving integrated circuit 2100 may include compensation resistance CR. The compensation resistance CR may compensate for a difference of the fanout resistance FR between each of output terminals of the display driving integrated circuit 2100. For example, a value of the compensation resistance CR connected to the signal lines DL at the center of the display panel 2300 may be greater than a value of the compensation resistance CR connected to the signal lines DL in a peripheral area of the display panel 2300. Therefore, a difference of a path resistance for each data line DL may be compensated for, and the brightness of the display panel 2300 may become uniform.

The first passive device P1 is the same as described with reference to FIGS. 1 through 2C. Based on the descriptions given herein, one of ordinary skill in the art may easily achieve embodiments implementing the passive device P1*a* of FIG. 3 and the passive device P1*b* of FIG. 5, rather than the passive device P1.

Any of the elements and/or functional blocks disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. The processing circuitry may include electrical components such as at least one of transistors, resistors, capacitors, etc. The processing circuitry may include electrical components such as logic gates including at least one of AND gates, OR gates, NAND gates, NOT gates, etc.

While inventive concepts has been particularly shown and described with reference to various example embodiments thereof, it will be understood that various changes in form and details may be made therein without departing from the spirit and scope of the following claims. Furthermore example embodiments are not necessarily mutually exclusive with one another. For example, some example embodiments may include one or more features described with reference to one or more figures, and may also include one or more other features described with reference to one or more other figures.

What is claimed is:

1. An integrated circuit comprising:
   a substrate;
   one or more active devices on the substrate;
   a plurality of interlayer dielectrics on the substrate;
   a first metallization pattern on the plurality of interlayer dielectrics;
   a first lower electrode on the first metallization pattern;
   a first dielectric layer on the first lower electrode; and
   a first upper electrode on the first dielectric layer,
   wherein a thickness of the first metallization pattern in a first direction perpendicular to the substrate is not uniform, and
   wherein a lower surface of the first metallization pattern is planar, and an upper surface of the first metallization pattern has variable thickness.

2. The integrated circuit of claim 1, wherein
   the first metallization pattern includes aluminum, and
   the first lower electrode and the first upper electrode include titanium nitride.

3. The integrated circuit of claim 1, wherein the first metallization pattern includes an overlapping portion overlapping the first upper electrode and a remaining portion horizontally apart from the first upper electrode.

4. The integrated circuit of claim 3, wherein a first thickness of the remaining portion in the first direction is different from a second thickness of the overlapping portion in the first direction.

5. The integrated circuit of claim 3, wherein a first thickness of the remaining portion in the first direction is less than a second thickness of the overlapping portion in the first direction.

6. The integrated circuit of claim 1, wherein the first upper electrode includes:
a first row portion extending in a second direction parallel to the substrate;
a first column portion extending in a third direction parallel to the substrate and perpendicular to the second direction; and
a second row portion extending in the second direction and apart from the first row portion with the first column portion between the first row portion and the second row portion.

7. The integrated circuit of claim 6, wherein the first column portion is connected to each of the first row portion and the second row portion.

8. The integrated circuit of claim 6, further comprising:
a first contact connected to the first upper electrode and extending in the first direction; and
a second contact connected to the first upper electrode and extending in the first direction.

9. The integrated circuit of claim 8, wherein
the first contact is connected to the first row portion, and the second contact is connected to the second row portion.

10. The integrated circuit of claim 1, further comprising:
a second metallization pattern on the plurality of interlayer dielectrics;
a second lower electrode on the second metallization pattern;
a second dielectric layer on the second lower electrode; and
a second upper electrode on the second dielectric layer, wherein a thickness of the second metallization pattern in the first direction is uniform.

11. The integrated circuit of claim 10, further comprising:
a third contact connected to the second upper electrode and extending in the first direction; and
a fourth contact connected to the second metallization pattern and extending in the first direction.

12. The integrated circuit of claim 10, wherein the second upper electrode has a quadrangular planar shape.

13. The integrated circuit of claim 1, wherein, when viewed in plan view, the first upper electrode is arranged as a serpentine.

14. The integrated circuit of claim 1, wherein the first upper electrode, the first dielectric layer, and the first lower electrode correspond to a metal-insulator-metal resistor.

15. The integrated circuit of claim 1, wherein a thickness of the first metallization pattern is thinner in a trench portion, and an upper surface of the first upper electrode is at a same level with an interlayer dielectric layer between trench portions.

16. The integrated circuit of claim 8, wherein the first upper electrode includes:
a second column portion extending in the third direction and continuous with the second row portion;
a third row portion extending in the second direction and continuous with the second column portion;
a third column portion extending in the third direction and continuous with the third row portion;
a fourth row portion extending in the second direction and continuous with the third column portion;
a fourth column portion extending in the third direction and continuous with the third row portion;
a fifth row portion extending in the second direction and continuous with the fourth column portion.

17. The integrated circuit of claim 16, wherein the second contact is on the fifth row portion.

18. The integrated circuit of claim 17, wherein a resistance value between the first contact and the second contact is a sum of line resistance values of the first row portion, the second row portion, the third row portion, the fourth row portion, the fifth row portion, the first column portion, the second column portion, the third column portion, and the fourth column portions.

19. A display device comprising:
an operational amplifier; and
the integrated circuit of claim 1, the integrated circuit connected to the operational amplifier.

20. The display device of claim 19, further comprising:
a display panel connected to the integrated circuit of claim 1.

* * * * *